United States Patent
Kimura et al.

(10) Patent No.: US 9,376,336 B2
(45) Date of Patent: Jun. 28, 2016

(54) QUARTZ GLASS CRUCIBLE, METHOD FOR PRODUCING THE SAME, AND METHOD FOR PRODUCING SILICON SINGLE CRYSTAL

(75) Inventors: Akihiro Kimura, Nishishirakawa-gun (JP); Suguru Matsumoto, Nishishirakawa-gun (JP); Izumi Fusegawa, Nishishirakawa-gun (JP); Katsuhiko Miki, Nishishirakawa-gun (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 608 days.

(21) Appl. No.: 13/824,874

(22) PCT Filed: Sep. 26, 2011

(86) PCT No.: PCT/JP2011/005368
§ 371 (c)(1),
(2), (4) Date: Mar. 18, 2013

(87) PCT Pub. No.: WO2012/060050
PCT Pub. Date: May 10, 2012

(65) Prior Publication Data
US 2013/0174777 A1    Jul. 11, 2013

(30) Foreign Application Priority Data
Nov. 5, 2010 (JP) .................... 2010-248818

(51) Int. Cl.
*C30B 15/02* (2006.01)
*C03B 20/00* (2006.01)
(Continued)

(52) U.S. Cl.
CPC ............... *C03B 20/00* (2013.01); *C03B 19/095* (2013.01); *C03B 19/14* (2013.01); *C03B 23/20* (2013.01);
(Continued)

(58) Field of Classification Search
CPC ................... C30B 15/02; C30B 15/08
See application file for complete search history.

(56) References Cited

U.S. PATENT DOCUMENTS

| 5,917,103 A * | 6/1999 | Watanabe ............. C03B 19/095 117/213 |
| 2003/0029195 A1* | 2/2003 | Watanabe ............. C03B 19/095 65/17.4 |

(Continued)

FOREIGN PATENT DOCUMENTS

| CN | 1341080 A | 3/2002 |
| CN | 2884103 Y | 3/2007 |

(Continued)

OTHER PUBLICATIONS

Apr. 30, 2014 Office Action issued in Japanese Patent Application No. 2010-248818 (with partial translation).

(Continued)

*Primary Examiner* — Robert M Kunemund
(74) *Attorney, Agent, or Firm* — Oliff PLC (57) ABSTRACT

Described herein is a method for producing a quartz glass crucible, including the steps of: preparing a crucible base material that is made of quartz glass and has a crucible shape; producing a synthetic quartz glass material by the direct process or the soot process; processing the synthetic quartz glass material into a crucible shape without pulverizing the synthetic quartz glass material; and welding the synthetic quartz glass material processed into the crucible shape to the inner surface of the crucible base material. As a result, there are provided a quartz glass crucible that avoids generation of dislocation in a silicon single crystal, the generation of dislocation caused by the crucible itself, at the time of production of a silicon single crystal and has high heat resistance, a method for producing the quartz glass crucible, and a method for producing a silicon single crystal, the method using such a quartz glass crucible.

5 Claims, 1 Drawing Sheet

(51) Int. Cl.
| | |
|---|---|
| *C30B 15/08* | (2006.01) |
| *C03B 19/09* | (2006.01) |
| *C03B 19/14* | (2006.01) |
| *C03B 23/20* | (2006.01) |
| *C30B 15/10* | (2006.01) |
| *C30B 29/06* | (2006.01) |

(52) U.S. Cl.
CPC .................. *C30B 15/02* (2013.01); *C30B 15/08* (2013.01); *C30B 15/10* (2013.01); *C30B 29/06* (2013.01); *C03B 2201/23* (2013.01); *Y02P 40/57* (2015.11); *Y10T 117/1032* (2015.01)

(56) References Cited

U.S. PATENT DOCUMENTS

| | | | |
|---|---|---|---|
| 2003/0041623 | A1 | 3/2003 | Werdecker et al. |
| 2005/0235907 | A1 | 10/2005 | Ohama et al. |

FOREIGN PATENT DOCUMENTS

| | | |
|---|---|---|
| CN | 101624721 A | 1/2010 |
| CN | 201527173 U | 7/2010 |
| JP | U 62-175077 | 11/1987 |
| JP | A-4-295018 | 10/1992 |
| JP | A-6-329493 | 11/1994 |
| JP | A-8-40735 | 2/1996 |
| JP | A-8-48532 | 2/1996 |
| JP | A-11-228291 | 8/1999 |
| JP | A-2001-240494 | 9/2001 |
| JP | A-2001-324029 | 12/2001 |
| JP | A-2004-2082 | 1/2004 |
| JP | A-2005-239533 | 9/2005 |

OTHER PUBLICATIONS

May 8, 2013 International Preliminary Report on Patentability issued in International Application No. PCT/JP2011/005368.

Murakawa, Hishoshitsu Silica Zairyo Oyo Handbook, Realie Corp., 1999, pp. 25.

Practical Manual for Amorphous Siliceous Materials, Realize Inc., 1999, pp. 26-29.

Dec. 13, 2011 International Search Report issued in International Application No. PCT/JP2011/005368.

Sep. 28, 2014 Office Action issued in Chinese Patent Application No. 201180053097.7.

Sep. 20, 2014 Search Report issued in Chinese Patent Application No. 201180053097.7.

Wang et al; "Quartz Glass;" Chemical Industry Press; Jan. 31, 2007; pp. 1.

* cited by examiner

QUARTZ GLASS CRUCIBLE, METHOD FOR PRODUCING THE SAME, AND METHOD FOR PRODUCING SILICON SINGLE CRYSTAL

TECHNICAL FIELD

The present invention relates to a quartz glass crucible used in pulling a silicon single crystal upwardly by the Czochralski process, a method for producing the quartz glass crucible, and a method for producing a silicon single crystal, the method using such a quartz glass crucible.

BACKGROUND ART

In the production of a silicon single crystal, a method called the Czochralski process (the CZ process) is widely adopted. In the production of a silicon single crystal by the Czochralski process, in general, the inside of a quartz glass crucible (also called a quartz crucible) is filled with polycrystalline silicon (polysilicon), the polycrystalline silicon (polysilicon) is melted by heating to obtain silicon melt, a seed crystal is immersed in the silicon melt and then pulled upwardly, whereby a silicon single crystal ingot is grown.

In the past, it has been pointed out that, during the growth of a silicon single crystal, an air bubble contained in a quartz glass crucible expands under high temperature and an inner periphery of the crucible is delaminated, resulting in the generation of dislocation in the silicon single crystal (refer to Patent Document 1, for example) and the surface of the quartz glass crucible changes from an amorphous state to cristobalite and the cristobalite is delaminated, resulting in the generation of dislocation in the silicon single crystal (refer to Patent Document 2, for example).

As for cristobalitization (crystallization) of the surface of the quartz glass crucible during the production of a silicon single crystal by the Czochralski process, according to Patent Document 3 and Patent Document 4, there are statements "crystallization occurs in the form of dots from a nucleus for crystal formation as a starting point at an early stage of crystallization, and the crystallization spreads in the form of a ring with the progress of pulling of a single crystal", "with such progression of the crystallization, a crystallization spot is generated. Since the outer periphery of this crystallization spot takes on a brown color, the crystallization spot is sometimes called a brown spot.", and "the crystallization spot increases with the passage of the single crystal pulling time, that is, the time in which the silicon melt makes direct contact with the inner surface of the quartz crucible, but, after a lapse of a predetermined time, the density of a crystallization spot converges to a constant density and remains at that density". Moreover, there is also a statement "after such a crystallization spot is generated, the crystallization spot begins to melt by the silicon melt and the size of the crystallization spot becomes gradually small".

The cristobalitization of the surface of the quartz glass crucible is said to be promoted when the crucible contains a high concentration of impurities such as alkali metal. Moreover, in terms of the influence on device characteristics, a low impurity concentration is preferable. Therefore, the quartz glass crucible is required to contain no air bubble and contain a low concentration of impurities.

Examples of a method for producing synthetic quartz glass containing no air bubble and containing an extremely low concentration of impurities include a direct process and a soot process. The direct process is a synthetic method to directly deposit and vitrify synthetic quartz glass by hydrolyzing a silicon compound such as silicon tetrachloride ($SiCl_4$) in oxyhydrogen flames. Moreover, the soot process is a method for producing synthetic quartz glass by the following procedure. First, by hydrolyzing a silicon compound such as silicon tetrachloride ($SiCl_4$) in oxyhydrogen flames at a temperature of about 1100° C. which is lower than the temperature of the direct process, a mass (soot) of porous silica is synthesized. This soot is treated with heat in an appropriate gas such as a chlorine compound to remove water therefrom. Then, the soot is heated from the lower end thereof and is vitrified by being pulled downwardly while being rotated at a temperature of about 1500° C. or higher (refer to Non patent Literature 1).

By making a quartz glass crucible by using such synthetic quartz glass, it is possible to avoid generation of dislocation in a silicon single crystal, but the heat resistance (also called resistance to heat deformation and deformation resistance) of the crucible itself is low (in other words, the crucible tends to be deformed under high temperature). As a method for solving this problem related to heat resistance, for example, there are (1) a method by which synthetic quartz glass synthesized from a silane compound is pulverized, heated and melted under vacuum, and molded into a crucible (Patent Document 5) and (2) a method by which a synthetic quartz glass material produced by a direct flame method performed on a silane compound, the synthetic quartz glass material whose hydrogen molecule content is $1\times10^{17}$ molecules/$cm^3$ or more, is turned into synthetic quartz glass powder after undergoing pulverization, particle size adjustment, and cleaning processes, and the synthetic quartz glass powder is electrically melted under vacuum at 1500 to 1900° C. and is then molded (Patent Document 6).

With the method of Patent Document 5, by pulverizing synthetic quartz glass by setting the particle size at the time of pulverization at 600 μm or less and performing vacuum pressure melting thereon at a pressure of $10^{-1}$ Torr at 1500 to 1900° C. to reduce the content of hydroxyl group and chlorine, it is possible to make a synthetic quartz glass crucible with high heat resistance. As a result of the vacuum pressure melting having being performed, an air bubble having a size of 1 mm or more is not contained in the crucible. This is better than the air bubble level (for example, about three air bubbles having a size of 1 to 2 mm and no air bubble having a size of 2 mm or more per crucible) of a quartz glass crucible produced by a normal arc melting method. The arc melting method is a method for producing a quartz glass crucible by feeding raw material powder into a rotating mold to form a raw material powder layer in the crucible shape and heating the raw material powder layer by arc discharge from the inside thereof and melting it (refer to Patent Document 7, for example).

Moreover, according to the method of Patent Document 6, a synthetic quartz glass material which is made to have a hydrogen molecule content of $1\times10^{16}$ molecules/$cm^3$ or more, a strain point of 1130° C. or higher, and an OH group content of 1 ppm or less and a chlorine content of 1 ppm or less is highly-pure and is allowed to have a viscosity at high temperature of $10^{10}$ poise or more at 1400° C., for example, making it possible to use this as a material for a crucible for pulling a silicon single crystal.

Furthermore, Patent Document 8 discloses a method by which quartz glass pieces obtained by melting quartz raw material powder in an atmosphere of inert gas and purifying it by keeping it at 2000° C. or higher at 0.05 torr or more of vacuum for 5 hours or longer are bonded to the inner surface of a quartz glass crucible and merging them together by heating and melting. Moreover, as the heating and melting method, the use of arc discharge, an oxyhydrogen flame burner, and the like is illustrated as an example.

CITATION LIST

Patent Literature

Patent Document 1: JP-A-6-329493
Patent Document 2: JP-A-2001-342029
Patent Document 3: JP-A-2001-240494
Patent Document 4: JP-A-11-228291
Patent Document 5: JP-A-8-40735
Patent Document 6: JP-A-8-48532
Patent Document 7: JP-A-2005-239533
Patent Document 8: JP-A-2004-2082
Patent Document 9: JP-A-4-295018

Non Patent Literature

Non patent Literature 1: Practical Manual for Amorphous Siliceous Materials, Realize Inc., 1999

SUMMARY OF INVENTION

Technical Problem

As described above, to avoid generation of dislocation in a silicon single crystal when a silicon single crystal is pulled upwardly by the Czochralski process, a quartz glass crucible is required to be highly-pure (that is, contain few impurities) and contain no air bubble, and, at the same time, the heat resistance of the crucible is needed.

Since both of the methods of Patent Document 5 and Patent Document 6 pulverize synthetic quartz, these methods obtain a crucible containing fewer air bubbles as compared to the arc melting method, but air bubbles are not completely eliminated. As a result, in the present situation where the heat load on a quartz glass crucible is increased because a silicon single crystal is getting larger these days, an air bubble in the crucible expands during the production of a silicon single crystal. This often results in generation of dislocation in a silicon single crystal.

Moreover, the quartz material used in the method of Patent Document 8 is quartz glass pieces obtained by melting and purifying powder of synthetic quartz. Therefore, a few air bubbles are present in the quartz glass pieces. As a result, even when a silicon single crystal is produced by using a quartz glass crucible disclosed in Patent Document 8, it is impossible to suppress sufficiently generation of dislocation in the silicon single crystal. Furthermore, even with the heating and melting method, it is actually very difficult to weld the glass pieces to the quartz glass crucible with an oxyhydrogen flame burner because heat cannot be transferred successfully. In addition, when a crucible is getting larger, there is a high possibility that the use of the oxyhydrogen flame burner and arc discharge causes the crucible and a plate material to break due to a large temperature gradient caused by local heating, which makes it very difficult to weld the glass pieces actually to the quartz glass crucible.

The present invention has been made in view of these problems, and an object thereof is to provide a quartz glass crucible that avoids generation of dislocation in a silicon single crystal, the generation of dislocation caused by the crucible itself, at the time of production of a silicon single crystal and has high heat resistance, a method for producing the quartz glass crucible, and a method for producing a silicon single crystal, the method using such a quartz glass crucible.

Solution to Problem

The present invention has been made to solve the above-described problems and provides a method for producing a quartz glass crucible, including the steps of: preparing a crucible base material that is made of quartz glass and has a crucible shape; producing a synthetic quartz glass material by a direct process or a soot process; processing the synthetic quartz glass material into a crucible shape without pulverizing the synthetic quartz glass material; and welding the synthetic quartz glass material processed into the crucible shape to an inner surface of the crucible base material.

With such a method, since the synthetic quartz glass material produced by the direct process or the soot process is processed into the crucible shape without being pulverized, it is possible to obtain a synthetic quartz glass material in the crucible shape, the synthetic quartz glass material that contains practically no air bubble and keeps an extremely low concentration of impurities. Moreover, since the synthetic quartz glass material is welded to the inner surface of the crucible base material made of quartz glass, a portion of the quartz glass crucible, the portion made of the synthetic quartz glass material, can be used as a crucible inner surface that makes contact with the silicon melt at the time of production of a silicon single crystal, making it possible to avoid generation of dislocation in a silicon single crystal, the generation of dislocation caused by an air bubble or cristobalite.

Furthermore, even when such a synthetic quartz glass material is used as a material forming a crucible, since the synthetic quartz glass material is welded to the crucible base material, it is possible to use the heat resistance of the crucible base material. This prevents a problem such as heat deformation etc. of the synthetic quartz glass material itself and makes it possible to ensure the heat resistance of the quartz glass crucible.

In this case, the welding can be performed at the same time by the application of heat performed when the synthetic quartz glass material processed into the crucible shape is placed inside the crucible base material, the inside of the synthetic quartz glass material is filled with polycrystalline silicon, and the polycrystalline silicon is melted in a silicon single crystal pulling apparatus.

Moreover, the present invention provides a method for producing a silicon single crystal, wherein a silicon single crystal is produced by producing the quartz glass crucible at the same time as the melting of the polycrystalline silicon by such a method for producing a quartz glass crucible and then pulling a silicon single crystal upwardly from silicon melt produced by the melting of the polycrystalline silicon by the Czochralski process.

As described above, by performing welding of the synthetic quartz glass material and the crucible base material at the same time by the application of heat performed when the polycrystalline silicon is melted in the silicon single crystal pulling apparatus and then pulling a silicon single crystal upwardly from the silicon melt, it is possible to reduce the number of processes as a whole and there is no need to cool the crucible. This makes it possible to reduce the total energy and the production time that are required to produce a silicon single crystal.

Moreover, in the method for producing a quartz glass crucible of the present invention, the welding can also be performed by placing the synthetic quartz glass material processed into the crucible shape inside the crucible base material and heating the crucible base material and the synthetic quartz glass material by using an electric furnace.

Furthermore, in the method for producing a quartz glass crucible according to the present invention, the welding can also be performed by placing the synthetic quartz glass material processed into the crucible shape inside the crucible base material and heating the crucible base material and the synthetic quartz glass material in a silicon single crystal pulling apparatus.

As described above, the welding of the synthetic quartz glass material and the crucible base material can also be performed by the application of heat by the electric furnace or in the pulling apparatus. In addition, since it is possible to perform welding of the whole portion at once, there is no possibility that a local temperature gradient is generated and a crack is generated.

Moreover, in the method for producing a quartz glass crucible of the present invention, it is preferable that, in the production of the synthetic quartz glass material, the synthetic quartz glass material is produced as a synthetic quartz glass material with a hydroxyl group content of 100 to 800 ppm.

By setting the concentration of hydroxyl group (OH group) in the synthetic quartz glass material at such a value, it is possible to suppress generation of dislocation in a silicon single crystal more effectively.

Furthermore, in the method for producing a quartz glass crucible of the present invention, it is preferable that, in the production of the synthetic quartz glass material, the synthetic quartz glass material is produced as a plate-like synthetic quartz glass material having a thickness of 1 mm or more.

As described above, by producing the synthetic quartz glass material as a plate-like synthetic quartz glass material having a thickness of 1 mm or more, it is possible to prevent breakage when the synthetic quartz glass material is processed into the crucible shape. Moreover, it is possible to prevent breakage when the synthetic quartz glass material is processed into the crucible shape, and, after the synthetic quartz glass material is placed inside the crucible base material or before the synthetic quartz glass material is then welded thereto, the synthetic quartz glass material is filled with polycrystalline silicon that is a material of a silicon single crystal.

Moreover, in the method for producing a quartz glass crucible of the present invention, in the processing of the synthetic quartz glass material into the crucible shape, the crucible shape can be formed from one or more synthetic quartz glass materials.

As described above, processing of the synthetic quartz glass material into the crucible shape may be performed in such a way that the crucible shape is formed from one synthetic quartz glass material or the crucible shape is formed by combining a plurality of synthetic quartz glass materials by welding or the like.

Furthermore, the present invention provides a quartz glass crucible produced by any one of the above-described methods for producing a quartz glass crucible.

As described above, since a quartz glass crucible produced by the method for producing a quartz glass crucible of the present invention is a quartz glass crucible obtained by welding a synthetic quartz glass material that contains practically no air bubble and contains an extremely low concentration of impurities to the inner surface of a crucible base material, a portion made of the synthetic quartz glass material can be used as a crucible inner surface that makes contact with the silicon melt at the time of production of a silicon single crystal, making it possible to avoid generation of dislocation in a silicon single crystal, the generation of dislocation caused by an air bubble or cristobalite. Moreover, the crucible base material ensures the heat resistance of the quartz glass crucible.

In addition, the present invention provides a quartz glass crucible including: a crucible base material that is made of quartz glass and has a crucible shape; and a synthetic quartz glass material in a crucible shape, the synthetic quartz glass material welded to an inner surface of the crucible base material, and the synthetic quartz glass material is produced by a direct process or a soot process and contains practically no air bubble.

Since such a quartz glass crucible is a quartz glass crucible obtained by welding the synthetic quartz glass material produced by the direct process or the soot process, that is, the synthetic quartz glass material that contains practically no air bubble and contains an extremely low concentration of impurities to the inner surface of the crucible base material, when a silicon single crystal is produced, it is possible to avoid generation of dislocation in a silicon single crystal, the generation of dislocation caused by an air bubble or cristobalite. Moreover, it is possible to ensure the heat resistance of the quartz glass crucible.

In this case, it is preferable that the synthetic quartz glass material has a hydroxyl group content of 100 to 800 ppm.

By setting the concentration of hydroxyl group in the synthetic quartz glass material at such a value, it is possible to suppress generation of dislocation in a silicon single crystal more effectively.

Moreover, it is preferable that the synthetic quartz glass material has a thickness of 1 mm or more.

As described above, by making the synthetic quartz glass material have a thickness of 1 mm or more, it is possible to prevent breakage when the synthetic quartz glass material is filled with polycrystalline silicon that is a material of a silicon single crystal.

Furthermore, the present invention provides a method for producing a silicon single crystal, wherein a silicon single crystal is produced by holding silicon melt in any one of the above-described quartz glass crucibles and pulling a silicon single crystal upwardly from the silicon melt by the Czochralski process.

As described above, with the method for producing a silicon single crystal by the Czochralski process, the method using the quartz glass crucible of the present invention, it is possible to produce a silicon single crystal while avoiding generation of dislocation in a silicon single crystal, the generation of dislocation caused by an air bubble or cristobalite.

Advantageous Effects of Invention

With the method for producing a quartz glass crucible according to the present invention, it is possible to produce a quartz glass crucible by using, as a crucible inner surface that makes contact with silicon melt at the time of production of a silicon single crystal, a synthetic quartz glass material produced by the direct process or the soot process, the synthetic quartz glass material that contains practically no air bubble and contains an extremely low concentration of impurities because the synthetic quartz glass material is not pulverized. By producing a silicon single crystal by using such a quartz glass crucible, it is possible to avoid generation of dislocation in a silicon single crystal, the generation of dislocation caused by an air bubble or cristobalite.

DESCRIPTION OF EMBODIMENTS

Hereinafter, the present invention will be described in more detail, but the present invention is not limited to the description below.

Figure 1:
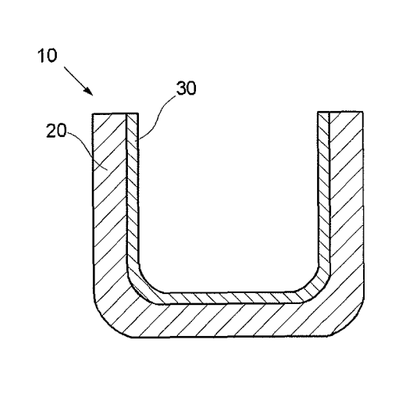
FIG. 1 is a schematic sectional view of a quartz glass crucible of the present invention.

In FIG. 1, a schematic sectional view of a quartz glass crucible of the present invention is depicted.

A quartz glass crucible 10 of the present invention is made of at least quartz glass and includes a crucible base material 20 in the crucible shape and a synthetic quartz glass material 30 that is welded to an inner surface of the crucible base material 20 and has the crucible shape. The synthetic quartz glass material 30 is produced by the direct process or the soot process and contains practically no air bubble.

As will be described later, the synthetic quartz glass material 30 is a synthetic quartz glass material produced by the direct process or the soot process, the synthetic quartz glass material that is processed and formed into the crucible shape without being pulverized and welded to the crucible base material 20.

Even when the synthetic quartz glass material 30 that tends to be thermally deformed is used as a material forming the crucible, since the synthetic quartz glass material 30 is welded to the crucible base material 20, it is possible to use the heat resistance of the crucible base material 20, which makes it possible to ensure the heat resistance of the quartz glass crucible 10.

Such a quartz glass crucible 10 can be produced in the following manner.

First, the crucible base material 20 that is made of quartz glass and has the crucible shape is prepared (step a).

The crucible base material 20 that is prepared here simply has to be a normal quartz glass crucible. However, to differentiate the crucible base material 20 from a quartz glass crucible which is produced by the present invention, the crucible base material 20 is referred to as a "crucible base material" in the description of the present invention. As the crucible base material of the present invention, it is necessary simply to use a quartz glass crucible that is currently used industrially, and the production method thereof is not limited to a particular method and, for example, an arc melting method that is currently performed industrially may be adopted. The arc melting method is a method for producing a quartz glass crucible by feeding raw material powder into a rotating mold to form a raw material powder layer in the crucible shape and heating the raw material powder layer by arc discharge from the inside thereof and melting it as disclosed in Patent Document 7, for example. In addition to the arc melting method, the crucible base material can be produced by the sol-gel process, the slip casting method, or the like. In this case, the inner surface of the crucible base material does not have to be a high-purity layer or an air bubble-free layer.

On the other hand, the synthetic quartz glass material 30 in the crucible shape, the synthetic quartz glass material 30 to be welded to the inner surface of the crucible base material 20, is prepared in the following manner.

First, a synthetic quartz glass material is produced by the direct process or the soot process (step b). With the direct process or the soot process, it is possible to produce a synthetic quartz glass material that contains practically no air bubble and contains an extremely low concentration of impurities.

At this time, it is preferable to produce the synthetic quartz glass material as a plate-like synthetic quartz glass material having a thickness of 1 mm or more. When the thickness of the synthetic quartz glass material is 1 mm or more, as will be described later, it is possible to prevent breakage when the synthetic quartz glass material is processed into the crucible shape. Moreover, as will be described later, it is also possible to prevent breakage when the synthetic quartz glass material is filled with polycrystalline silicon which is a material of a silicon single crystal. On the other hand, it is preferable that the thickness of the synthetic quartz glass material is 10 mm or less. With such a thickness, there is no possibility that the time of processes such as rounding process is excessively increased. Moreover, the plate-like synthetic quartz glass material is marketed as a synthetic quartz glass material for a photomask or the like and is easily available.

Next, the synthetic quartz glass material is processed into the crucible shape without being pulverized (step c). As a result, it is possible to obtain the synthetic quartz glass material 30 in the crucible shape as depicted in FIG. 1.

In this step, since the synthetic quartz glass material produced by the direct process or the soot process is processed without being pulverized, it is possible to obtain the synthetic quartz glass material 30 in the crucible shape, the synthetic quartz glass material 30 that contains practically no air bubble and keeps an extremely low concentration of impurities. Moreover, since the number of processes is reduced, it is possible to prepare the synthetic quartz glass material 30 inexpensively.

The above-described processing of the synthetic quartz glass material produced by the direct process or the soot process without pulverizing the synthetic quartz glass material means performing processing after cutting the shape of a mass, a plate, or the like, from the synthetic quartz glass material produced by the direct process or the soot process without processing the synthetic quartz glass material into powder (for example, powder having an average particle size of 1 mm or less).

In step c, it is necessary simply to process the synthetic quartz glass material into the crucible shape, and a specific method is not limited to a particular method. Moreover, in processing the synthetic quartz glass material into the crucible shape, the crucible shape may be formed from one synthetic quartz glass material or the crucible shape may be formed from a plurality of synthetic quartz glass materials.

When the crucible shape is formed from one synthetic quartz glass material, for example, the synthetic quartz glass material is pressed against a jig made of carbon or synthetic quartz while being subjected to heat, whereby the synthetic quartz glass material can be processed into the crucible shape at once. In such a case, the synthetic quartz glass material in the shape of a plate is preferable because such a synthetic quartz glass material can be processed easily.

When the crucible shape is formed from a plurality of synthetic quartz glass materials, the synthetic quartz glass materials may be provided as synthetic quartz glass pieces that can be easily processed into the crucible shape. The shape of each of these synthetic quartz glass pieces is not limited to a particular shape.

As for the plurality of synthetic quartz glass materials, the crucible shape can be formed from the plurality of synthetic quartz glass materials by rounding or the like and welding using an oxyhydrogen flame burner or the like. Such processing, welding, and the like simply have to be performed before a process (step d), which will be described later, in which welding to the crucible base material is performed. Moreover, the plurality of synthetic quartz glass materials in their entirety simply have to form the crucible shape and the plurality of synthetic quartz glass materials in the crucible shape simply have to be welded to the crucible base material, and a plurality of synthetic quartz glass pieces do not necessarily have to be merged in advance by welding or the like.

Through step b and step c described above, the synthetic quartz glass material 30 in the crucible shape is prepared.

It is possible to perform the preparation of the crucible base material (step a) and the production of the synthetic quartz glass material and processing the synthetic quartz glass material into the crucible shape (step b and step c) independently. The preparation of the crucible base material may be performed before the production of the synthetic quartz glass material and processing the synthetic quartz glass material into the crucible shape and vice versa, and they may be performed concurrently.

Next, the synthetic quartz glass material 30 processed into the crucible shape is welded to the inner surface of the crucible base material 20 (step d), whereby the quartz glass crucible 10 is produced.

This welding has to be performed securely. Specifically, there are, for example, three methods described below.

(First Welding Method)

In a first welding method, first, the synthetic quartz glass material 30 processed into the crucible shape is placed (set) inside the crucible base material 20. The synthetic quartz glass material 30 in the crucible shape at this time may be either the synthetic quartz glass material 30 obtained by processing one synthetic quartz glass material into the crucible shape or the synthetic quartz glass material 30 obtained by forming a plurality of synthetic quartz glass materials into the crucible shape by welding. In this case, the synthetic quartz glass material obtained by merging the synthetic quartz glass materials in advance is used. Next, the inside of the synthetic quartz glass material 30 is filled with polycrystalline silicon. Then, by the application of heat performed when the polycrystalline silicon is melted in a silicon single crystal pulling apparatus, welding of the crucible base material 20 and the synthetic quartz glass material 30 in the crucible shape is performed at the same time as the melting of the polycrystalline silicon. The power (the power for heating) and the heating time are arbitrarily set and, as is the case with ordinary melting of the polycrystalline silicon, can be determined depending on the sizes etc. of the pulling apparatus and the crucible.

With this method, the quartz glass crucible 10 is produced at the same time as the melting of the polycrystalline silicon. In this case, after the polycrystalline silicon is melted and the quartz glass crucible is produced, also inside the pulling apparatus, by pulling a silicon single crystal by the Czochralski process from the silicon melt produced by the melting of the polycrystalline silicon, it is possible to produce a silicon single crystal.

By doing so, after the quartz glass crucible 10 is produced, it is not necessary to cool the quartz glass crucible 10 until a silicon single crystal is produced. As a result, it is possible to reduce the total energy required to produce a silicon single crystal. Moreover, this makes it possible to minimize an increase in the number of processes and suppress an increase in cost and has the advantage that the synthetic quartz glass material is welded evenly to the crucible base material due to the presence of the silicon melt placed inside.

(Second Welding Method)

In a second welding method, the synthetic quartz glass material 30 processed into the crucible shape is placed inside the crucible base material 20, and welding is performed by heating the crucible base material 20 and the synthetic quartz glass material 30 by using an electric furnace.

(Third Welding Method)

In a third welding method, the synthetic quartz glass material 30 processed into the crucible shape is placed inside the crucible base material 20, and welding is performed by heating the crucible base material 20 and the synthetic quartz glass material 30 in the silicon single crystal pulling apparatus.

In the case of the second and third welding methods, as the synthetic quartz glass material 30 in the crucible shape, the synthetic quartz glass material 30 obtained by processing one synthetic quartz glass material into the crucible shape or the synthetic quartz glass material 30 obtained by processing a plurality of synthetic quartz glass materials by rounding or the like and then performing welding thereon to make them have the crucible shape can be placed inside the crucible base material 20. Moreover, the synthetic quartz glass material 30 may be placed inside the crucible base material 20, after the synthetic quartz glass material 30 is obtained by processing a plurality of synthetic quartz glass materials by rounding, in such a way that the synthetic quartz glass materials form the crucible shape in their entirety while keeping the state of a plurality of glass pieces without being merged in advance by welding or the like. In this case, they are merged and welded to the crucible base material 20 at the same time in the welding process.

Furthermore, in the case of the second and third welding methods, a jig made of carbon or synthetic quartz, for example, may be set inside the synthetic quartz glass material 30 in the crucible shape and pressed against the synthetic quartz glass material 30 by pressure in such a way as to sandwich the synthetic quartz glass material 30 between the jig and the crucible base material 20. In particular, when the synthetic quartz glass material 30 processed into the crucible shape is formed of a plurality of glass pieces (in a state in which the plurality of glass pieces are not merged by welding), to prevent the glass pieces located in an upper part from slipping down before they are merged, it is preferable to rotate the crucible base material 20 or make the crucible base material 20 have a tapered body instead of making the crucible base material 20 have a vertical body.

Moreover, the power (the power for heating) and the heating time are arbitrarily set and can be determined as needed.

In any of the first to third welding methods, to prevent the glass pieces located in an upper part from falling before they are welded to the crucible base material 20, it is preferable to weld the crucible base material 20 and the synthetic quartz glass material 30 together in the top end portion of the crucible. Furthermore, it is preferable to provide an air vent to prevent atmospheric gas from being confined between the crucible base material 20 and the synthetic quartz glass material 30.

By performing welding of the whole portion at once, welding of the crucible base material 20 and the synthetic quartz glass material 30 in the crucible shape have to be performed securely.

Performing this welding partially by using the oxyhydrogen flame burner is actually very difficult because it is impossible to transfer heat successfully to the whole portion. Moreover, in particular, when the crucible is large (for example, has a diameter of 24 inches (60 cm) or more), there is a high possibility that the use of the oxyhydrogen flame burner and arc discharge causes the crucible and a plate material to break due to a large temperature gradient caused by local heating, which makes it very difficult to perform welding actually. Therefore, these methods are undesirable.

Through steps a to d described above, it is possible to produce the quartz glass crucible 10 depicted in FIG. 1.

By producing a silicon single crystal by the Czochralski process by using such a quartz glass crucible 10 according to the present invention, it is possible to produce a silicon single crystal while avoiding generation of dislocation in the silicon single crystal, the generation of dislocation caused by an air bubble or cristobalite.

Except for the use of the quartz glass crucible 10 of the present invention, it is possible to produce a silicon single crystal by the usual Czochralski process. That is, silicon melt is held in the quartz glass crucible 10 of the present invention and a silicon single crystal is pulled upwardly from the silicon melt by the Czochralski process; in this way, a silicon single crystal is produced. Moreover, a publicly-known technique related to the Czochralski process, such as growing a silicon single crystal while applying a magnetic field, can be performed as appropriate.

However, in the case of the above-described "first welding method", as described earlier, by the application of heat performed when the polycrystalline silicon is melted in the silicon single crystal pulling apparatus, welding of the crucible base material 20 and the synthetic quartz glass material 30 processed into the crucible shape is performed at the same time as the melting of the polycrystalline silicon. Also in this method, subsequent pulling of a silicon single crystal from the silicon melt can be performed in the same manner as in the production of a silicon single crystal by the usual Czochralski process.

It is preferable that the synthetic quartz glass material 30 after welding, the synthetic quartz glass material 30 forming the quartz glass crucible 10, has a thickness of 1 mm or more. This is achieved by, for example, producing a plate-like synthetic quartz glass material having a thickness of 1 mm or more in the production of the synthetic quartz glass material (step b), processing this synthetic quartz glass material into the crucible shape, and welding the synthetic quartz glass material to the crucible base material 20.

When the synthetic quartz glass material 30 has a thickness of 1 mm or more, it is possible to prevent breakage when the synthetic quartz glass material 30 is filled with polycrystalline silicon which is a material of a silicon single crystal. Moreover, it is possible to prevent contact between the silicon melt and the crucible base material 20, the contact caused by the melting of the synthetic quartz glass material 30, during the production of a silicon single crystal. This makes it possible to bring the silicon melt into contact with the surface of the synthetic quartz glass material 30 at all times, the synthetic quartz glass material 30 that contains practically no air bubble and contains an extremely low concentration of impurities, and prevent generation of dislocation in a silicon single crystal more effectively.

Moreover, in the production of the synthetic quartz glass material (step b), it is preferable to produce the synthetic quartz glass material as a synthetic quartz glass material with a hydroxyl group content of 100 to 800 ppm.

This requirement of the hydroxyl group content of the synthetic quartz glass material is based on the following findings about the crystallization of the quartz glass crucible during the production of a silicon single crystal by the Czochralski process, the findings made by the inventors of the present invention.

When the hydroxyl group content is high, the crystallization (that is, cristobalitization) of the synthetic quartz glass (amorphous state) is promoted. As described earlier, the crystallization of an amorphous state is caused by impurities such as alkali metal, and crystallization caused by impurities is crystallization with a high degree of crystallization to such an extent that it is called denitrification. On the other hand, the inventors of the present invention have found out that crystallization caused by a hydroxyl group is crystallization with a low degree of crystallization.

When cristobalitization of the synthetic quartz glass does not occur at all from the start of the production of a silicon single crystal to the end thereof, generation of dislocation in a silicon single crystal, the generation of dislocation caused by delamination of cristobalite, does not occur. However, in actuality, the surface of the quartz glass crucible changes to cristobalite to some extent. As described earlier, according to Patent Document 3 and Patent Document 4, this crystallization "occurs in the form of dots from a nucleus for crystal formation as a starting point at an early stage of crystallization, and the crystallization spreads in the form of a ring with the progress of pulling of a single crystal", "with such progression of the crystallization, a crystallization spot is generated. Since the outer periphery of this crystallization spot takes on a brown color, the crystallization spot is sometimes called a brown spot.", and "the crystallization spot increases with the passage of the single crystal pulling time, that is, the time in which the silicon melt makes direct contact with the inner surface of the quartz crucible, but, after a lapse of a predetermined time, the density of a crystallization spot converges to a constant density and remains at that density". Moreover, there is also a statement "after such a crystallization spot is generated, the crystallization spot begins to melt by the silicon melt and the size of the crystallization spot becomes gradually small". That is, on the surface of the quartz glass crucible, crystallization and melting of the crystallized portion occur.

Therefore, the inventors of the present invention have found out that, in crystallization caused by impurities, the crystallization with a high degree of crystallization, the size of cristobalite that is delaminated is large and the cristobalite reaches the solid-liquid interface of a silicon single crystal before the cristobalite is completely dissolved in the silicon melt and causes generation of dislocation in the silicon single crystal; on the other hand, in crystallization caused by a hydroxyl group, for example, the crystallization with a low degree of crystallization, the size of cristobalite that is delaminated is small and the cristobalite is dissolved in the silicon melt before reaching the solid-liquid interface of a silicon single crystal and does not cause generation of dislocation in the silicon single crystal.

When the hydroxyl group content is 100 ppm or more, the crystallization speed of the inner surface of the quartz glass crucible is not too slow and an increase in the number of brown spots during the production of a silicon single crystal is suppressed, making it possible to suppress generation of dislocation in a silicon single crystal, the generation of dislocation caused by delamination of cristobalite. On the other hand, when the hydroxyl group content is 800 ppm or less, crystallization of the surface of the crucible is not promoted excessively, the size of cristobalite that is delaminated is small, and it is possible to suppress generation of dislocation in a silicon single crystal. Since the synthetic quartz glass material 30 forming the quartz glass crucible 10 is highly pure, there is no need to give much consideration to crystallization caused by impurities such as alkali metal, and, when a synthetic quartz glass material with a hydroxyl group content of 100 to 800 ppm is used, crystallization of the inner surface of the quartz glass crucible is adequately promoted during the melting of raw material polycrystalline silicon, and, when the production of a silicon single crystal is started, together with the melting of the surface of the crucible, the size of cristobalite that is delaminated becomes small, generation of dislocation in a silicon single crystal is avoided more effectively. The hydroxyl group content of the synthetic quartz glass material 30 is, more preferably, 300 to 700 ppm and, most preferably, 500 to 700 ppm.

A method for adjusting the hydroxyl group content of the synthetic quartz glass material is not limited to a particular method. For example, as disclosed in Patent Document 9, by using a multitubular burner as a flame burner and changing the composition ratio of a mixed gas of a raw material silane compound and oxygen gas as combustible gas, the mixed gas which is fed from a central nozzle of the multitubular burner, or mixing an inert gas into combustible gas, it is possible to control the surface temperature of a growth melting surface at the time of production of synthetic quartz glass.

EXAMPLES

Hereinafter, the present invention will be described specifically by using examples and a comparative example, but these examples do not limit the present invention.

Example 1

By the soot process, a plate material made of a synthetic quartz glass material with a hydroxyl group content of 50 ppm was produced. This synthetic quartz glass material was cut in accordance with the shape of the inner surface of a crucible base material (with a hydroxyl group content of 150 ppm) made of quartz glass and having a diameter of 32 inches (800 mm), the crucible base material produced by the arc melting method, subjected to rounding and welding, and formed into the crucible shape. The synthetic quartz glass material 30 processed into the crucible shape was placed inside the crucible base material 20 (refer to FIG. 1), and the inside thereof was filled with 400 kg of polycrystalline silicon.

The crucible base material and the synthetic quartz glass material placed inside the crucible base material were set in a pulling apparatus, and the raw material polycrystalline silicon was melted. At the same time as the melting of the polycrystalline silicon, the crucible base material and the synthetic quartz glass material were welded, whereby the quartz glass crucible 10 was obtained. Then, a horizontal magnetic field of 4000 gauss (0.4 tesla) was applied and a silicon single crystal having a diameter of 300 mm was pulled upwardly.

The above process was repeated ten times.

Example 2

Except for the production of, as a plate material made of a synthetic quartz glass material, a plate material with a hydroxyl group content of 100 ppm by the soot process, a quartz glass crucible was produced in the same manner as in Example 1, and a silicon single crystal was pulled upwardly.

Example 3

Except for the production of, as a plate material made of a synthetic quartz glass material, a plate material with a hydroxyl group content of 200 ppm by the soot process, a quartz glass crucible was produced in the same manner as in Example 1, and a silicon single crystal was pulled upwardly.

Example 4

Except for the production of, as a plate material made of a synthetic quartz glass material, a plate material with a hydroxyl group content of 600 ppm by the direct process, a quartz glass crucible was produced in the same manner as in Example 1, and a silicon single crystal was pulled upwardly.

Example 5

Except for the production of, as a plate material made of a synthetic quartz glass material, a plate material with a hydroxyl group content of 800 ppm by the direct process, a quartz glass crucible was produced in the same manner as in Example 1, and a silicon single crystal was pulled upwardly.

Example 6

Except for the production of, as a plate material made of a synthetic quartz glass material, a plate material with a hydroxyl group content of 1200 ppm by the direct process, a quartz glass crucible was produced in the same manner as in Example 1, and a silicon single crystal was pulled upwardly.

Comparative Example

A quartz glass crucible (with a hydroxyl group content of 150 ppm) having a diameter of 32 inches (800 mm), the quartz glass crucible produced by the arc melting method, was filled with 400 kg of polycrystalline silicon.

This quartz glass crucible was set in a pulling apparatus, and the raw material polycrystalline silicon was melted. Then, a horizontal magnetic field of 4000 gauss (0.4 tesla) was applied and a silicon single crystal having a diameter of 300 mm was pulled upwardly.

The above process was repeated ten times.

The numbers of times dislocation was generated in the silicon single crystals pulled upwardly in Examples 1 to 6 and Comparative Example are shown in Table 1. The number of times dislocation was generated is the sum of the number of times dislocation was generated in the first pulling of each single crystal (that is, 0 or 1), and does not include second generation of dislocation after remelting was performed when dislocation was generated. The reason for this is that remelting changes the surface state (an air bubble and the degree of crystallization) of the crucible.

TABLE 1

|  | Example 1 | Example 2 | Example 3 | Example 4 | Example 5 | Example 6 | Comparative Example |
|---|---|---|---|---|---|---|---|
| Method for producing an inner surface portion of a crucible | Soot process | Soot process | Soot process | Direct process | Direct process | Direct process | Arc melting method (The whole of a crucible was produced by the arc melting method) |

TABLE 1-continued

|  | Example 1 | Example 2 | Example 3 | Example 4 | Example 5 | Example 6 | Comparative Example |
|---|---|---|---|---|---|---|---|
| Hydroxyl group content (ppm) of an inner surface portion of a crucible | 50 | 100 | 200 | 600 | 800 | 1200 | 150 |
| The number of times dislocation was generated | 3 | 2 | 1 | 0 | 1 | 3 | 10 |

As is clear from Table 1, according to the method for producing a quartz glass crucible according to the present invention, by using, as a constituent material of a crucible inner surface portion, a synthetic quartz glass material that contains no air bubble and contains an extremely low concentration of impurities, it is possible to suppress generation of dislocation in a silicon single crystal. In particular, when the hydroxyl group content was 600 ppm (Example 4), it was possible to grow a silicon single crystal without generation of dislocation.

In Examples and Comparative Example described above, when dislocation was generated, remelting was performed after the generation of dislocation and a silicon single crystal was grown again, and a silicon single crystal with no dislocation was eventually obtained. However, to shorten the production time and increase productivity, it is necessary to avoid generation of dislocation, and the present invention is highly effective in increasing productivity. In addition, since highly-pure synthetic quartz glass is in contact with the silicon melt, it is possible to make a silicon single crystal to be obtained highly pure.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a quartz glass crucible, comprising the steps of:
    preparing a crucible base material that is made of quartz glass and has a crucible shape;
    producing a synthetic quartz glass material by a direct process or a soot process;
    processing the synthetic quartz glass material into a crucible shape without pulverizing the synthetic quartz glass material; and
    welding the synthetic quartz glass material processed into the crucible shape to an inner surface of the crucible base material
    wherein
    the welding is performed as the same time by the application of heat performed when the synthetic quartz glass material processed into the crucible shape is placed inside the crucible base material, the inside of the synthetic quartz glass material is filled with polycrystalline silicon, and the polycrystalline silicon is melted in a silicon single crystal pulling apparatus.

2. The method for producing a quartz glass crucible according to claim 1, wherein
    in the production of the synthetic quartz glass material, the synthetic quartz glass material is produced as a synthetic quartz glass material with a hydroxyl group content of 100 to 800 ppm.

3. The method for producing a quartz glass crucible according to claim 1, wherein
    in the production of the synthetic quartz glass material, the synthetic quartz glass material is produced as a plate-like synthetic quartz glass material having a thickness of 1 mm or more.

4. The method for producing a quartz glass crucible according to claim 1, wherein
    in the processing of the synthetic quartz glass material into the crucible shape, the crucible shape is formed from one or more synthetic quartz glass materials.

5. A method for producing a silicon single crystal, wherein a silicon single crystal is produced by producing the quartz glass crucible at the same time as the melting of the polycrystalline silicon by the method for producing a quartz glass crucible according to claim 1 and then pulling a silicon single crystal upwardly from silicon melt produced by the melting of the polycrystalline silicon by the Czochralski process.

* * * * *